(12) United States Patent
Brunemeier et al.

(10) Patent No.: US 6,873,026 B1
(45) Date of Patent: Mar. 29, 2005

(54) INHOMOGENEOUS MATERIALS HAVING PHYSICAL PROPERTIES DECOUPLED FROM DESIRED FUNCTIONS

(75) Inventors: Paul E. Brunemeier, Sunnyvale, CA (US); Archita Sengupta, San Jose, CA (US); Justin F. Gaynor, San Jose, CA (US); Robert H. Havemann, Pleasanton, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/092,201

(22) Filed: Mar. 4, 2002

(51) Int. Cl.$^7$ .............................. H01K 1/02; H01B 3/46; C08J 3/28
(52) U.S. Cl. ...................... 257/508; 257/499; 257/506; 252/570; 522/99; 522/148; 524/588; 528/32
(58) Field of Search .................. 252/570; 524/588; 522/99, 148; 528/32; 257/499, 508, 506

(56) References Cited

U.S. PATENT DOCUMENTS

| | | | |
|---|---|---|---|
| 6,260,949 B1 | 7/2001 | Smith et al. .................. 347/44 |
| 6,277,766 B1 * | 8/2001 | Ayers ......................... 438/778 |
| 6,329,062 B1 | 12/2001 | Gaynor ....................... 428/447 |
| 6,448,185 B1 * | 9/2002 | Andideh et al. ............. 438/706 |
| 6,495,253 B1 * | 12/2002 | Koyama et al. ............. 428/343 |
| 6,533,855 B1 * | 3/2003 | Gaynor et al. ......... 106/287.14 |
| 6,565,763 B1 * | 5/2003 | Asakawa et al. ............. 216/56 |
| 6,576,345 B1 * | 6/2003 | Van Cleemput et al. .... 428/447 |
| 6,599,177 B2 * | 7/2003 | Nevoret et al. ............. 451/526 |
| 2002/0192980 A1 * | 12/2002 | Hogle et al. ................ 438/778 |
| 2002/0198282 A1 * | 12/2002 | Jia .............................. 523/115 |
| 2003/0054115 A1 * | 3/2003 | Albano et al ............... 427/487 |

FOREIGN PATENT DOCUMENTS

| | | | |
|---|---|---|---|
| JP | 9-230600 | 9/1997 | .......... H01L/21/30 |
| JP | 2000-199962 | 7/2000 | .......... H01L/21/30 |
| JP | 2000-199963 | 7/2000 | .......... H01L/21/30 |

OTHER PUBLICATIONS

U.S. Provisional application No. 60/287,918.*
U.S. Provisional application No. 60/338,116.*
Kikkawa, Takamaro, "Proceedings of the International Electronic Devices Meeting," 12 10–13 00, pp. 253–256.
Levy, David, "Electrooptical Devices from Organically Doped sol–Gel Materials," Mol. Crust. And Liq. Cryst. 1000, vol. 354, pp. 159–165.
Katz, Alexander and Davis, Mark E., Molecular imprinting of bulk, microporous silica, Nature vol. 403 Jan. 20, 2000.
Jalone, Paavo and Tuominen, Aulis, "The Applicability of Electrodeposited Photoresis in Producing Ultra–fine Lines Using Sputtered Seeding Layer," IEEE 2000 In'l. Symp on Electronic MAterials &.
Sworakowski, J. et al. "Kinetics of Photochemical Reactions in Condensed Phases. What can be Borrowed from the methods of Dielectric Physics." IEEE. Transactions on Dielectrics and Electrical Insulation vol. 8 No. 3, Jun. 2001.

* cited by examiner

Primary Examiner—Jeffrey B. Robertson
(74) Attorney, Agent, or Firm—Silicon Valley Patent Group LLP

(57) ABSTRACT

A composition comprises a first component that provides a predetermined response to radiation, and a second component. Upon curing of the composition, portions of the first component bind together portions of the second component to form an inhomogeneous material having physical properties substantially determined by the second component. The function provided by the first component's response to radiation and the macroscopic properties determined by the second component are largely decoupled and thus may be separately optimized. Some embodiments provide photo-patternable low dielectric constant materials that may be advantageously employed in metal interconnect layers in integrated circuits, for example.

23 Claims, 8 Drawing Sheets

Polyhedral Oligomeric
Silsesquioxanes (POSS)

Where R is

Methyacrylate-POSS

R=vinyl —CH=CH$_2$

Vinyl-POSS

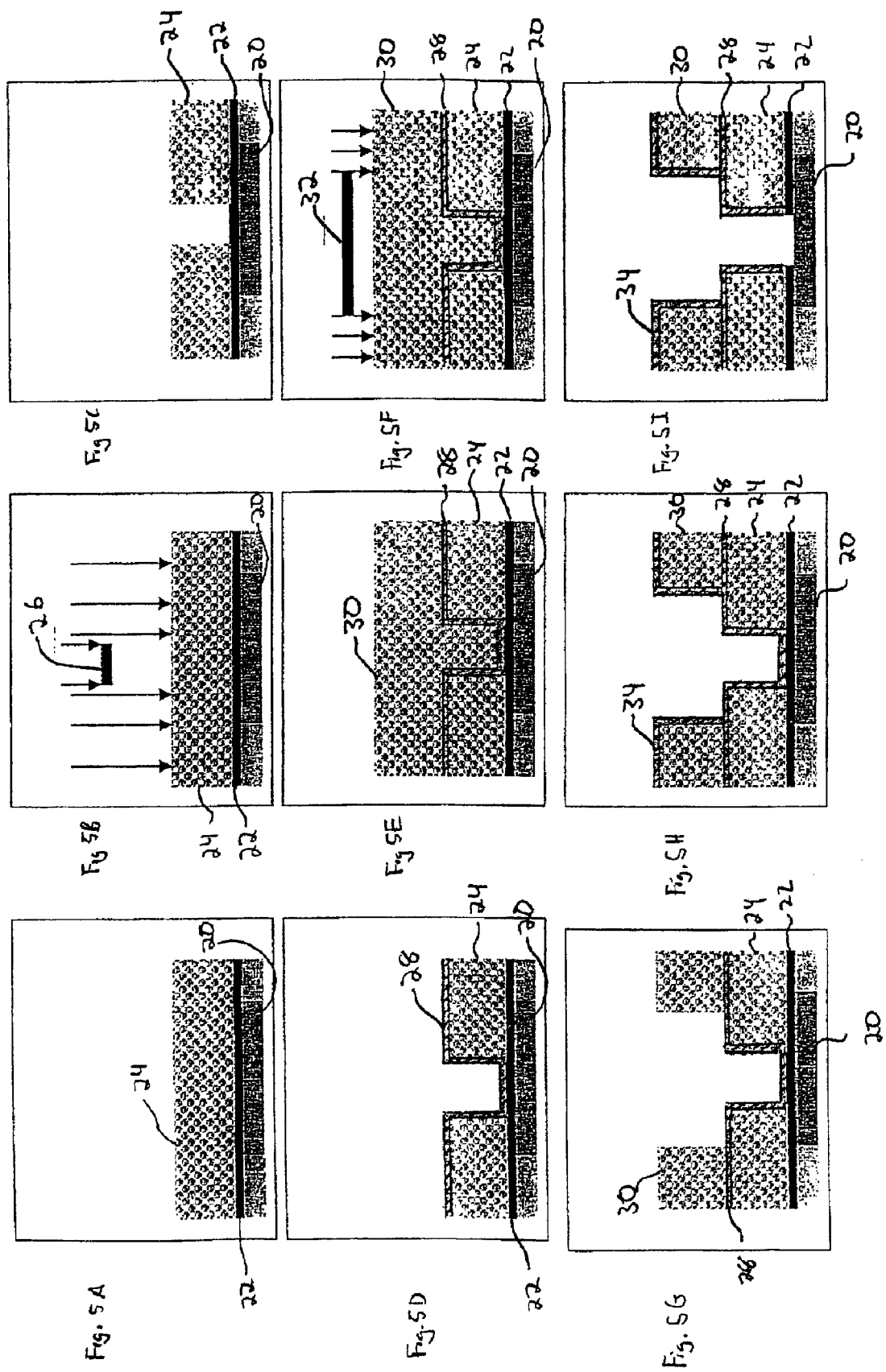

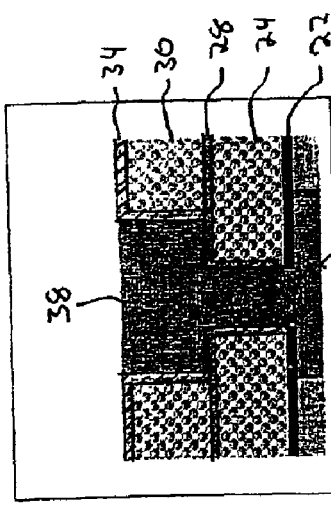
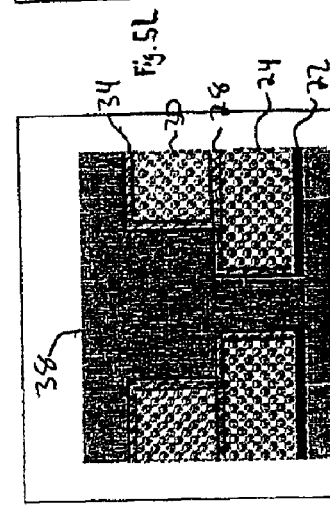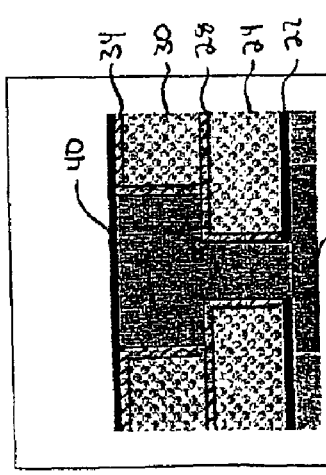
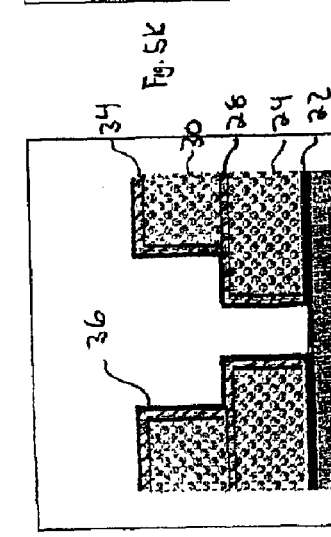

INHOMOGENEOUS MATERIALS HAVING PHYSICAL PROPERTIES DECOUPLED FROM DESIRED FUNCTIONS

FIELD OF THE INVENTION

The present invention relates generally to inhomogeneous materials in which the physical properties are decoupled from desired functions, and more particularly to directly patternable low k materials.

BACKGROUND

Microelectronic integrated circuits based on patterned semiconductor materials are continuing to evolve towards devices with an extremely high number of circuit elements per unit volume. As the features of these devices are reduced to smaller sizes, the performance of the materials that constitute the device will critically determine their success. One specific area in need of advancement is the electrical insulator used between the wires, metal lines, and other elements of the circuit. As the distances between the circuit elements become smaller, there will be increased problems due to capacitive coupling (crosstalk) and propagation delay, and to increased power dissipation associated with charge depletion from higher capacitance elements. These difficulties can be reduced by preparing the circuit using an insulating material that possesses a dielectric constant (k) as low as possible. It has been conventional to use materials such as silicon dioxide, silicon nitride, and cured silsesquioxanes as insulators. However, the dielectric constants of these materials range from 3.0–7.0 and thus will not be adequate for future circuits.

Fluorinated polymers and fully aliphatic hydrocarbon polymers may have dielectric constants less than about 2.4. However, these low k materials have not been shown to have sufficient thermal and mechanical stability to survive the heat and mechanical stresses occurring during IC fabrication. In addition, these polymers typically have chemical properties that are similar in some respects to the chemical properties of photoresist materials commonly used in IC fabrication. Thus, selective chemical removal of photoresist layers deposited on layers of these low k materials might be difficult or impossible.

Numerous photoresist deposition, patterning, development, and selective etching steps could be eliminated from IC fabrication if the low k material used in the IC were itself directly photo-patternable. This can lead to significant manufacturing cost reduction and manufacturing yield enhancement for production. In the Proceedings of the 2000 IEEE International Electron Devices Meeting, pages 253–256, for example, T. Kikkawa reported a process in which a film of methylsilsesquiazane (MSZ) was deposited on a substrate, patterned by exposure to ultraviolet light or to an electron beam, developed, and then thermally cured to form a patterned low k film of methylsilsesquioxane (MSQ).

A problem with Kikkawa's approach, however, is that an MSQ film created in this manner might be weaker than a directly applied and conventionally patterned MSQ film as a result, for example, of component evaporation that weakens the film. An additional problem with this approach is that the photo-patternability function of Kikkawa's film is not separated from the physical properties of the film. That is, the photopatternable feature of the film is part of the structure that provides the mechanical strength and determines the dielectric constant of the film. Consequently, it may be difficult to separately optimize, for example, the photo-patternability, dielectric constant, and strength of the final MSQ film. Another problem with Kikkawa's approach is that the dielectric constant of MSQ is typically in the range of 2.5 to 3.0, which is higher than the values of 1.0 to 2.2 desired by the semiconductor industry.

The coupling of the photo-patternability and physical properties of Kikkawa's film results from the typically homogenous nature of MSZ and MSQ films, which have uniform compositions and structures on length scales greater than molecular length scales (e.g., greater than tens of Angstroms). A general problem with such homogenous media is that their physical properties are often affected when new functions are engineered into the media.

There is a general need for materials in which the physical properties are largely decoupled from desired functions provided by the materials. In particular, there is a clear need for photo-patternable low k materials in which the photo-patternability function may be optimized without substantially affecting bulk physical properties of the resulting patterned material.

SUMMARY

One aspect of the invention provides a composition comprising a first component that provides a predetermined response to radiation, and a second component. Upon curing of the composition, portions of the first component bind together portions of the second component to form an inhomogeneous material having physical properties substantially determined by the second component. The function provided by the first component's response to radiation and the physical properties determined by the second component are largely decoupled and thus may be separately optimized. The physical properties substantially determined by the second component may be macroscopic and/or microscopic properties of the inhomogeneous material.

Some embodiments provide photo-patternable low dielectric constant materials that may be advantageously employed in metal interconnect layers in integrated circuits, for example. In one embodiment, for example, the composition comprises porous silica particles and a photosensitive binder component. In some implementations, this composition may be deposited as a layer on a substrate and then patterned by exposure to a radiation pattern. The photosensitive binder may respond to the radiation by polymerizing and/or cross-inking, for example, and thereby bind the porous silica particles together into a porous silica matrix. Regions of the layer not exposed to radiation could be subsequently removed. Alternatively, the photosensitive binder may respond to the radiation by dissociating, oxidizing, or otherwise degrading and thereby release porous silica particles from the layer. In this case, regions of the layer not exposed to radiation would remain on the substrate. In some implementations, the resulting photo-patterned layer has a dielectric constant less than about 2.6.

BRIEF DESCRIPTION OF THE DRAWINGS

FIGS. 5A–5M are schematic representations of a dual damascene process of fabricating structures with copper interconnects in accordance with an embodiment.

It should be noted that the dimensions in the figures are not necessarily to scale. Like reference numbers in the various figures denote like parts in the various embodiments.

DETAILED DESCRIPTION

Figure 1:
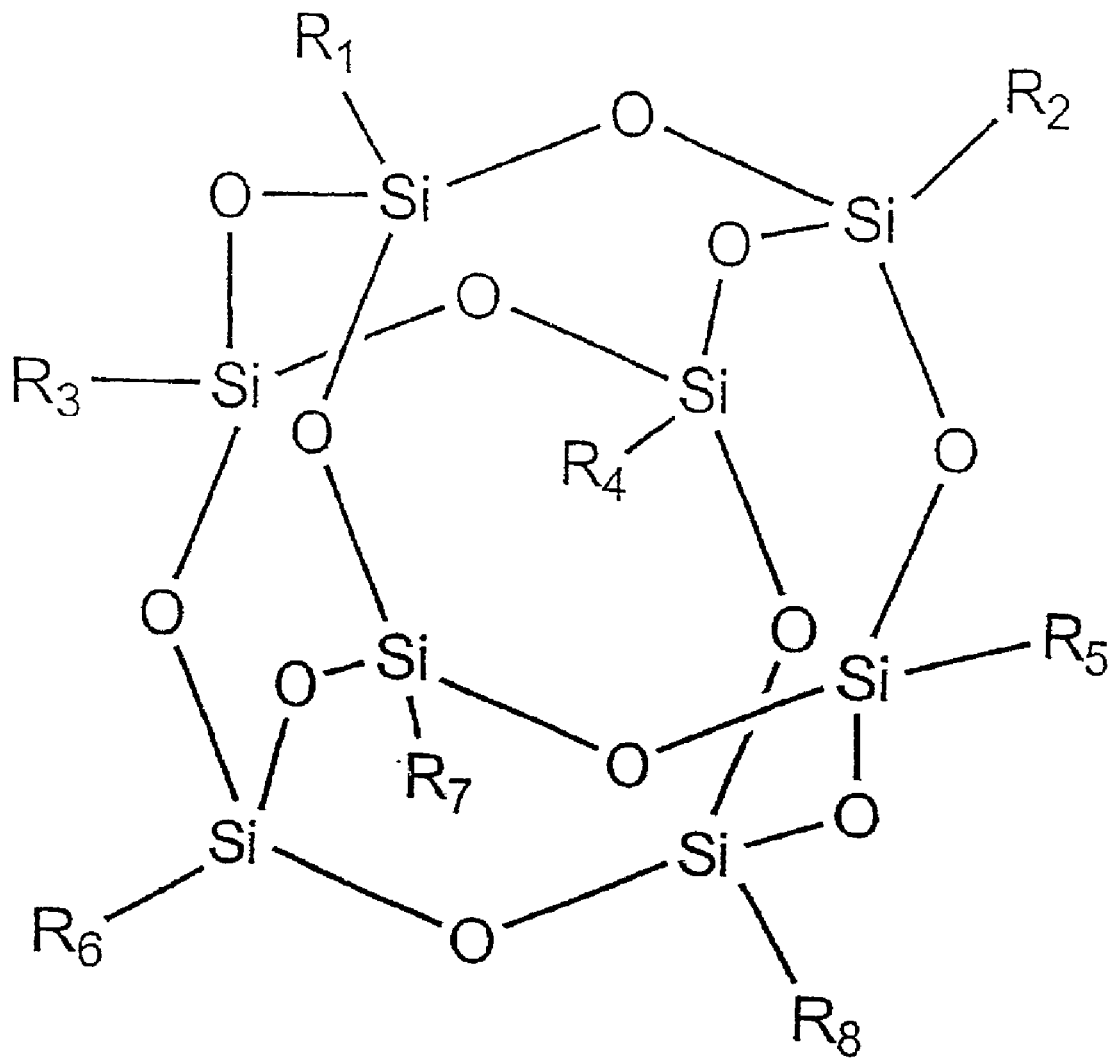
FIG. 1 is an atomic depiction of a POSS cage structure having eight substituent groups.

Disclosed herein are materials having at least some physical properties that are largely decoupled from desired functions provided by the materials. Examples of such physical properties include but are not limited to structural strength, dielectric constant, refractive index, density, coefficient of thermal expansion, and coefficient of elasticity. Examples of such desired functions include but are not limited to dissociation or degradation upon exposure to radiation (e.g., to light or to an electron beam), polymerization upon exposure to radiation, rotation of the polarization of light, and amplification of light. Materials having the polymerization or dissociation functions, for example, may be directly patterned by exposure to radiation.

The decoupling of physical properties from desired functions in the disclosed materials is accomplished by providing an inhomogeneous material having a nonuniform composition at length scales greater than the molecular length scale (e.g., greater than tens of Angstroms). The material includes one or more components that substantially determine physical properties of the material, and one or more binder components that bind portions of the other components together and also provide one or more desired functions. The inhomogeneity results, in part, from the intermixture of these two types of components. The two types of components are typically not spatially coincident, but are instead in locations designed to allow each the best optimization for its role. The binder components and the components that substantially determine physical properties of the material may be, respectively, minority and majority components.

The component or components that substantially determine physical properties of the inhomogeneous material do not necessarily entirely determine those properties. Variation in the nature or concentration of the binder components may also affect the physical properties, but typically to a lesser extent.

Typically, the binder components and the components substantially determining the physical properties of the material have little effect on each other's properties and functions. Consequently, there are few constraints on the choice of the binder component (and on arbitrary functions built into the binder components) other than that the binder components adequately bind the other components together. Hence, in the disclosed materials physical properties and desired functions may be optimized almost independently.

Also disclosed herein are devices incorporating the disclosed materials.

In one embodiment, a directly patternable low k material that may be used as an insulating layer in an integrated circuit includes porous silica particles and a photosensitive binder. When suitably bound, the porous silica particles substantially determine, for example, the hardness, stability, and dielectric constant of the low k material. The silica particles may also provide, for example, sufficient structural strength on a microscopic scale to contain copper electromigration during fabrication of an integrated circuit. The presence of the porous silica particles also allows the low k material to be processed by conventional semiconductor processing methods.

The photosensitive binder component binds the silica particles to each other to form a porous silica matrix having both intraparticle porosity and interparticle porosity. Variations in the concentration and/or nature of the binder component may affect the interparticle porosity and hence also the dielectric constant. For example, an increase in the binder concentration may decrease interparticle porosity and increase the dielectric constant of the material. Also, a binder that increases the spacing between the silica particles may thereby increase interparticle porosity and decrease the dielectric constant of the material. The resulting variations in the dielectric constant are typically fairly small and distributed about a value corresponding to that of a material including silica particles but no binder. Hence, the silica particles typically make the dominant contribution to the dielectric constant of the material.

In some implementations, the binder binds to the porous silica particles and responds to photoexcitation by polymerizing and/or cross-linking to thereby bind the porous silica particles together. Hence, in these implementations a film of the low k material may be patterned by methods similar to those used with negative photoresists. In other implementations, the binder responds to photoexcitation by dissociating, oxidizing, or otherwise degrading. In the latter implementations, a film of the low k material that has been cured thermally, for example, may be patterned by methods similar to those used with positive photoresists.

The size of the porous silica particles is typically greater than about five times the size of the binder molecules, and more typically greater than about ten times the size of the binder molecules. Consequently, the disclosed low k materials are inhomogeneous. Physical properties of the low k materials may be varied by adjusting the size, density, and packing density of the porous silica particles, for example, without affecting the photosensitive function of the binder component. Similarly, the photosensitive function of the binder component may be varied (between photopolymerizable and photodissociative, for example) without substantially affecting the physical properties of the low k material.

In one implementation, the porous silica particles include silicalite crystals or nanocrystals. Preparation of silicalite crystals and preparation of low k films including silicalite crystals are disclosed in U.S. Pat. No. 6,329,062 and in U.S. Pat. No. 6,533,855, both of which are assigned to the assignee of the present invention and incorporated herein by reference in their entirety.

Silicalite describes microporous crystalline oxides of silicon that are pure-silicon analogs of the well-known aluminosilicate zeolites. A number of silicalite crystal structures have been manufactured and identified using standard zeolite structure codes. The silicalites are true crystals, giving rise to characteristic x-ray powder diffraction patterns. However, the diffraction patterns are not always clear for nanocrystals, and so other methods, such as FTIR, have been used to show the existence of a particular crystal structure. Examples include but are not limited to the recognized crystalline forms conventionally abbreviated as follows: ABW, ACO, AEI, AEL, AEN, AET, AFG, AFI, AFN, AFO, AFR, AFS, AFT, AFX, AFY, AHT, ANA, APC, APD, AST, ASV, ATN, ATO, ATS, ATT, ATV, AWO, AWW, BCT, BEA, BEC, BIK, BOG, BPH, BRE, CAN, CAS, CFI, CGF, CGS, CHA, —CHI, —CLO, CON, CZP, DAC, DDR, DFO, DFT, DOH, DON, EAB, EDI, EMT, EPI, ERI, ESV, EUO, FAU, FER, FRA, GIS, GME, GON, GOO, HEU, IFR, ISV, ITE, JBW, KFI, LAU, LEV, LIO, LOS, LOV, LTA, LTL, LTN, MAZ, MEI, MEL, MEP, MER, MFI, MFS, MON, MOR, MSO, MTF, MTN, MTT, MTW, MWW, NAT, NES, NON, OFF, OSI, OSO, —PAR, PAU, PHI, RHO, —RON, RSN, RTE, RTH, RUT, SAO, SAS, SAT, SAV, SBE, SBS, SBT, SFE, SFF, SGT, SOD, STF, STI, STT, TER, THO, TON, TSC, VET, VFI, VNI, VSV, WEL —WEN, YUG or ZON. The detailed structures for these zeolites are given in conventional references, including the *Atlas of Crystal Structure* published by the International Zeolite Association, www.iza-online.org.

Silicalite is typically produced in aqueous solution, typically basic aqueous solution, which is a disadvantageous medium for many binders. However, U.S. Pat. No. 6,533,855 discloses procedures for dispersing silicalite and other zeolites in nonpolar solvents. For example, the surfaces of the nanocrystals may be treated with an amine or other coating to prevent agglomeration in the organic solvent. Some implementations use colloidal dispersions of silicalites in nonpolar solvents.

In some implementations, the directly patternable low k material uses silicalite nanocrystals that are smaller than the characteristic dimensions of the features in an integrated circuit device. In such cases, the individual silicalite crystals should be no larger than about 20% of the critical dimension of the smallest feature on the chip. Additionally, a negligible number of crystals should have a long axis greater than about 40% of the minimum critical dimension. For example, if metal lines 1000 Å wide and spaced 1000 Å apart are being formed, the size of the silicalite crystals should average less than about 200 Å along the longest axis, with a statistically insignificant percentage of them longer than about 400 Å along their longest axis. Otherwise, there are no restrictions on the crystal size or crystal size distribution. The crystals may be individual crystals or the crystals may be twinned or otherwise interpenetrating crystal masses, as long as each particle obeys the size restrictions listed above. Finally, any crystal structure of silicalite which is both less dense than quartz and thermally stable at temperatures above 500° C., i.e. which does not undergo crystal transformations at these temperatures, may be used. The silicalite particles arc substantially hydrophobic both at room temperature and up to 500° C., have greater modulus and hardness than amorphous silica and a smaller dielectric constant than amorphous silica.

Suitable binders for use in forming the low k material include but are not limited to derivatives of polyhedral oligomeric silsesquioxanes ("POSS") similar to those disclosed in U.S. patent application Ser. No. 09/953,547, assigned to the assignee of the present invention and incorporated herein by reference in its entirety. An eight silicon POSS cage structure having the general formula $Si_8O_{12}[R]_8$ (also known as a "caged siloxane") and used in some implementations is shown in FIG. 1. Appended groups $R_1$, $R_2$, ... $R_8$ may be the same or different in any combination. Other POSS structures including but not limited to POSS cages having different numbers of silicon atoms and R groups (e.g., 10 or 12) and POSS structures having partially opened cages may also be used.

Figure 2:
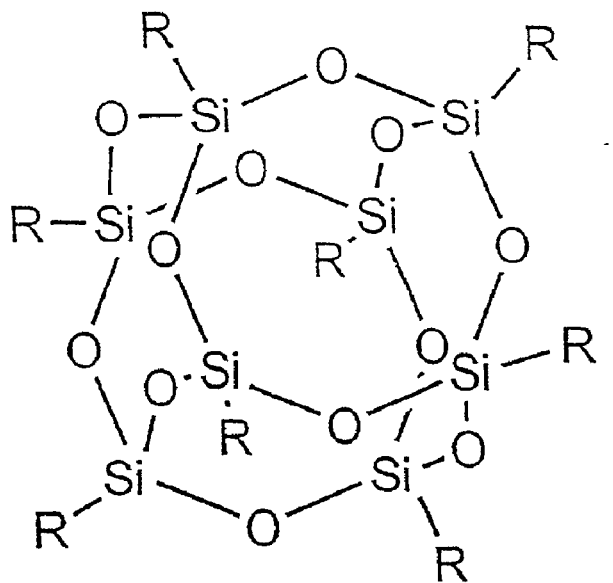
FIG. 2 is an atomic depiction of a methacrylate-substituted POSS.
Figure 2:
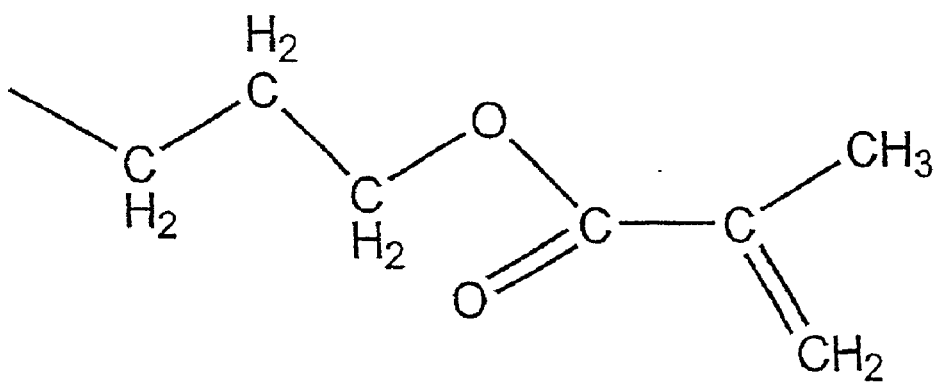

Some or all of the R group substituents on the POSS molecules are selected to be photoactive. In implementations in which the low k material is to be negatively patterned, the photoactive substituents on the POSS binder molecules may be selected to bind to other binder molecules (and optionally to silicalite particles) upon photoexcitation. For example, some implementations utilize the 8-fold substituted methacrylate-POSS shown in FIG. 2. This molecule, which is available from Hybrid Plastics, Inc. has the empirical formula $C_{56}H_{88}O_{28}Si_8$ and a molecular weight of 1,434 g/mole. Photoexcitation of this molecule under an oxygen atmosphere with ultraviolet light having a wavelength in the range of about 248 nanometers (nm) to about 254 nm results in generation of free radicals from the double bonds in the methacrylate groups. The free radicals may then react with other free radicals from double bonds in other binder molecules, for example, to propagate a cross-linked network that binds the silicalite particles together.

Methacrylate-substituted POSS binders such as that of FIG. 1 may also be used in combination with conventional ultraviolet initiators such as Irgacure 184 (available from Ciba Specialty Chemicals, Inc.) and Esacure KIP 100F (available from Sartomer Company, Inc.). Such ultraviolet initiators may decrease the dose of photons required to initiate the cross-linking process and/or extend the wavelength range over which the cross-linking may be initiated.

Figure 3:
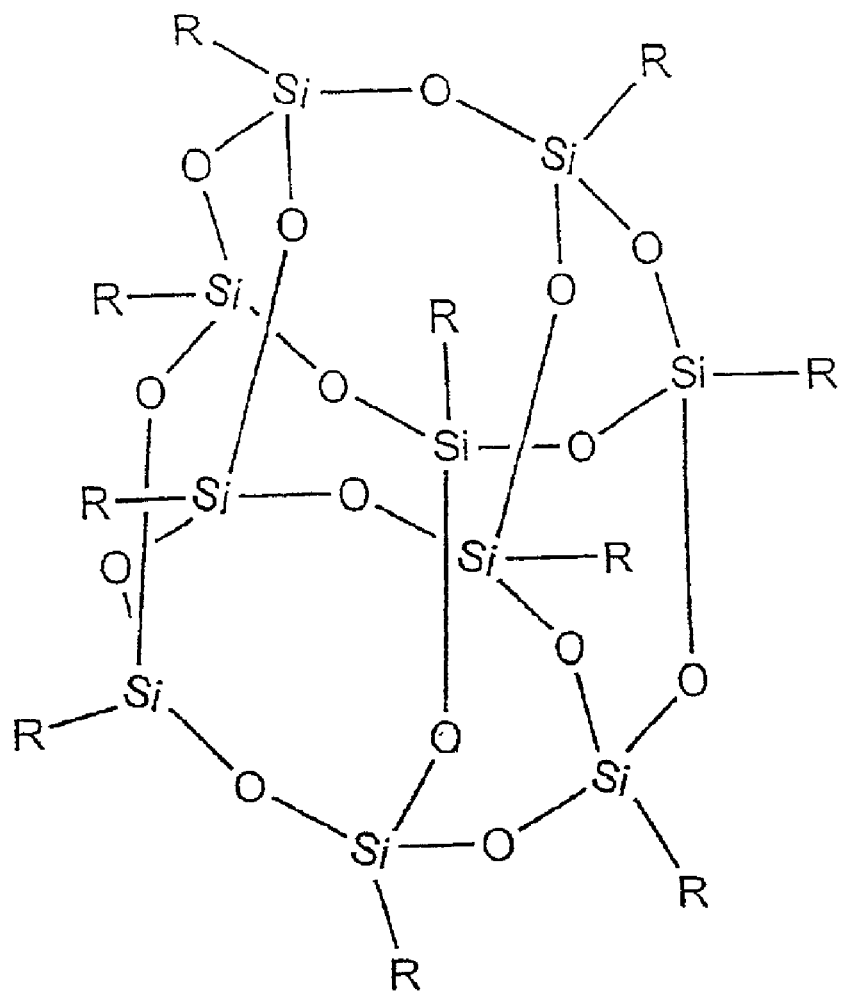
FIG. 3 is an atomic depiction of a vinyl-substituted POSS.

Another implementation in which the low k material is to be negatively patterned utilizes the 10-fold substituted vinyl-POSS shown in FIG. 3. This molecule, which is also available from Hybrid Plastics, Inc. has the empirical formula $C_{20}H_{30}O_{15}Si_{10}$ and a molecular weight of 791.31 g/mole. This binder molecule is typically used in combination with a conventional ultraviolet initiator such as those listed above. Free radicals generated from the double bonds in the vinyl groups may propagate a cross-linked network that binds the silicalite particles together. This process may be initiated, for example, with ultraviolet light having a wavelength in the range of about 248 nm to about 254 nm.

In implementations in which the low k material is to be positively patterned, the photoactive substituents on the POSS cage may be selected to dissociate or otherwise degrade upon photoexcitation and thereby disrupt a cross-linked network that was binding the silicalite particles together. For example, some implementations may utilize as binders POSS molecules that include silazane (Si—N) bonds. Such silazane bonds can be cleaved by exposure to light having a wavelength of about 220 nm. Other silazane containing molecules may also be used as binders. Suitable binders for positively patterned implementations may include the silazane containing molecules disclosed in Japanese Patent Publication Hei 9-230600 as useful in positively patterned photoresists, as well as derivatives of those molecules.

In one method of forming a directly patternable low k material, silicalite nanocrystals are supplied as a colloidal suspension or, more generally, as a slurry in a liquid medium. A slurry may contain, in addition to the colloidal suspension, particles that are not in a true colloidal suspension. The silicalite nanocrystals are present in the slurry at a concentration of from about 5% to about 40% by weight. A typical silicalite concentration is about 20 weight %. In one implementation, the binder component (e.g., a photosensitive substituted POSS) is added directly to the silicalite slurry and the resulting solution is mixed and then dispensed onto a substrate such as a semiconductor wafer. The amount of binder in the solution is typically limited to between about 0.1% and about 1% by volume.

The silicalite/binder solution may be dispensed onto the substrate by, for example, spin coating, dipping, spraying, printing, or any suitable conventional application process. In some implementations, for example, the silicalite/binder coating solution is spin coated onto a substrate using industry standard equipment and methods. Dispense and thickness spin steps may be followed by a soft bake step at a temperature between about 60° C. and about 250° C. for a total time of less than about 3 minutes, which serves to drive off the solvent in the coating solution. In some implementations upper limits on the time and temperature are determined by the requirement that the binder not significantly evaporate and that the particles remain substantially uncrosslinked. Ideally, in implementations utilizing spin coating the solvent mixture contains a low boiling point solvent, such as ethanol, and a high boiling point solvent, such methylisobutylketone (MIBK) and/or propyl propylene glycol (PPG). Those skilled in the art of spin coating arbitrarily distinguish low and high boiling point solvents as boiling below and above about 100° C., respectively.

In one implementation (negative patterning), after the silicalite/binder solution is spun onto the substrate to form a low k film, the film is optionally baked to drive off excess solvent, exposed to light to induce cross-linking in selected regions, developed with a solvent that removes the unexposed portions of the film, and (optionally) cured at a temperature of about 250° C. to about 450° C. for a time period of about 2 to about 60 minutes to promote further binding of the silicalite particles to the substrate and to each other. In another implementation (positive patterning), after being spun onto the substrate the film may be baked to drive off excess solvent, exposed to light to degrade selected portions of the film, developed with a solvent to remove the degraded portions of the film, and cured by thermal or other means. The order in which the last four steps occur may vary depending on the specific binder used.

Figure 4A:
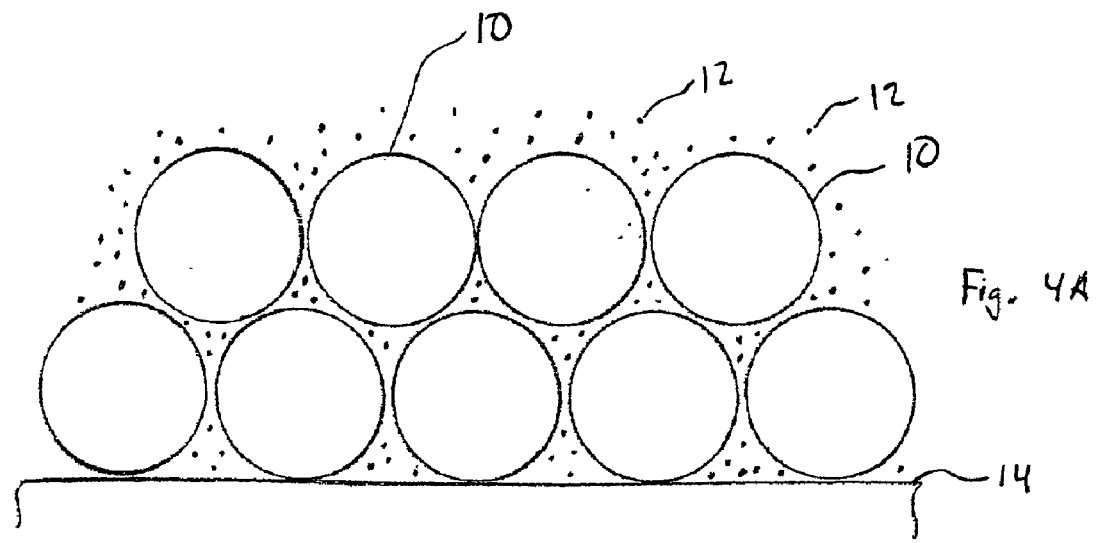
FIGS. 4A–4H schematically illustrate deposition, patterning, and development of a photo-patternable low k material in accordance with an embodiment.
Figure 4B:
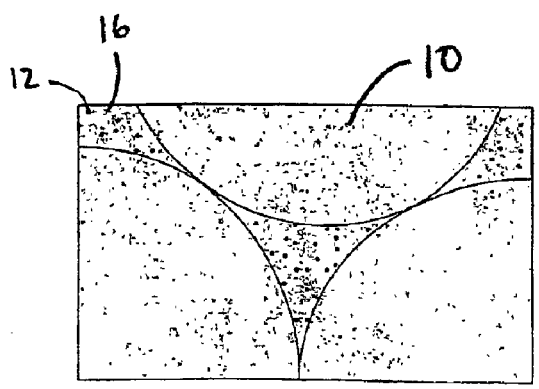
Figure 4C:
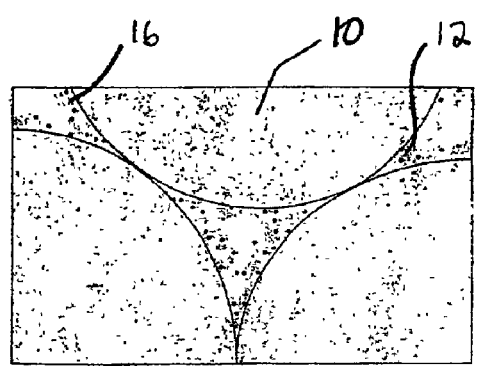
Figure 4D:
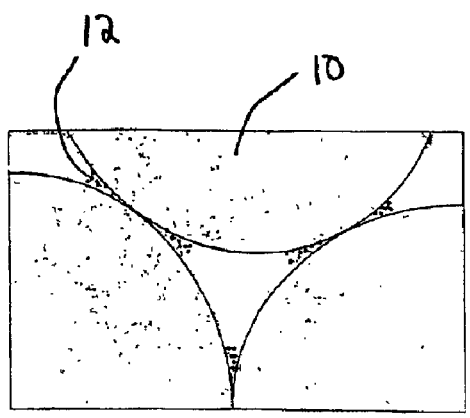
Figure 4E:
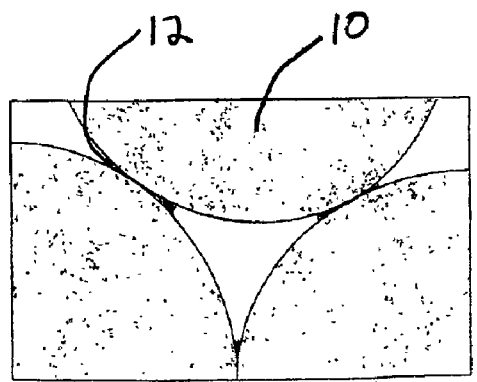
Figure 4F:
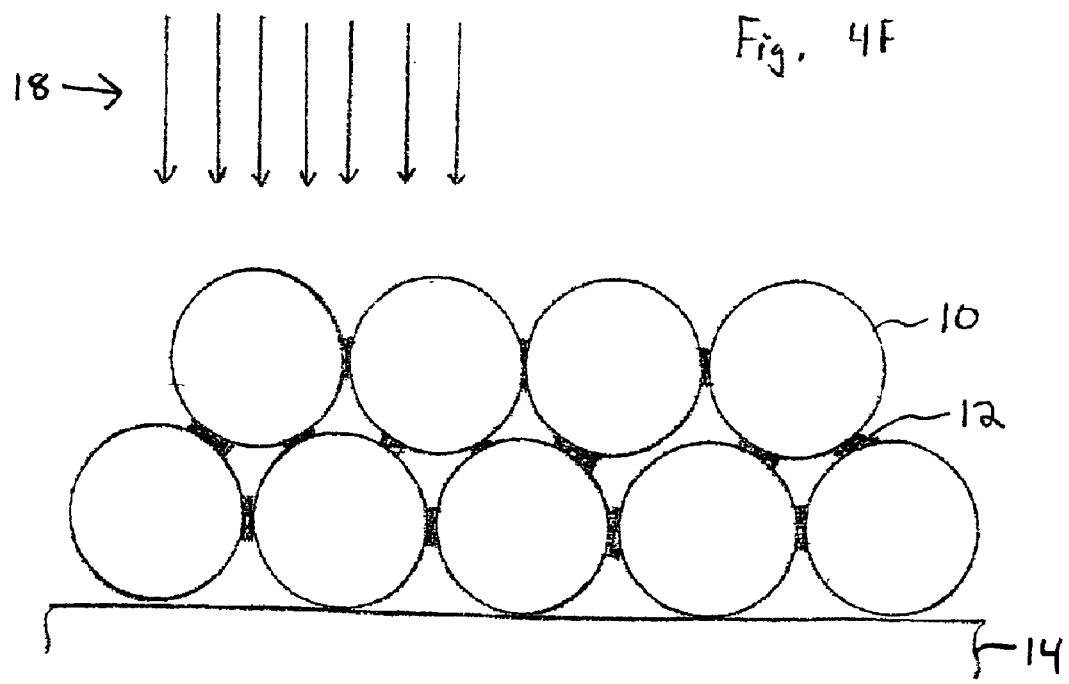
Figure 4G:
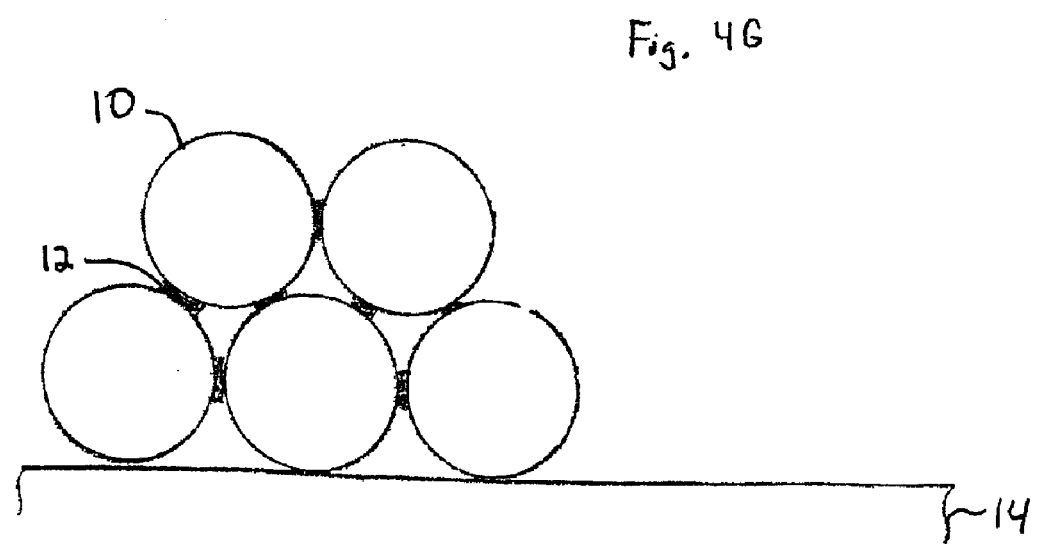
Figure 4H:
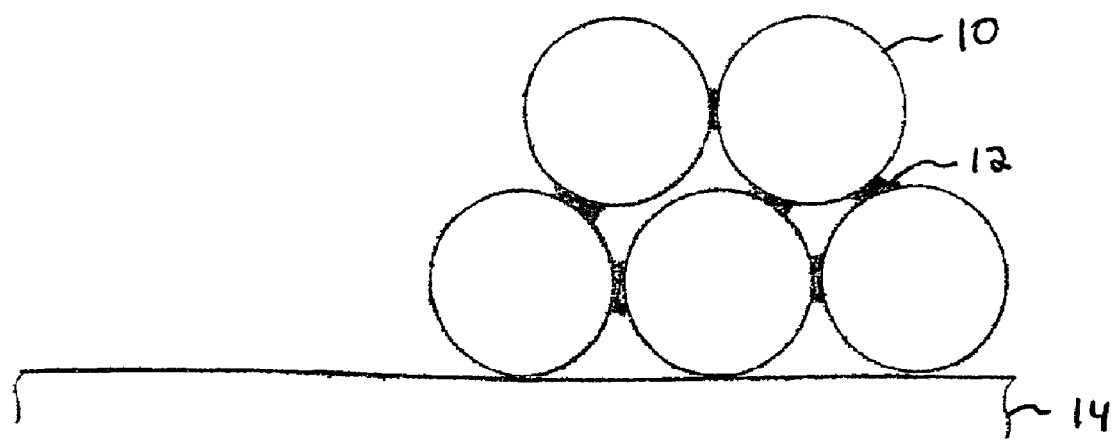

The changes in the silicalite/binder film during the process steps just described are shown schematically in FIGS. 4A–4H. In FIG. 4A, silicalite particles 10 and binder molecules 12 are shown as initially deposited on a substrate 14 during the spin-on step. At this point, the binder molecules are still substantially dispersed in solvent wetting the silicalite particles. As shown in FIGS. 4B–4E, the solvent 16 is believed to evaporate during further spinning and during any soft bake step or thermal curing step (for positive patterning) to leave the majority of the binder molecules at contact points between the silicalite particles. This is expected to occur because the smallest radii of curvature in the system are found near the contact points, and so therefore these are the last spaces from which the solvent evaporates. FIG. 4F shows a portion of the resulting film being exposed to light rays 18. After development with an appropriate solvent, the exposed portion either remains on the substrate as a cross-linked film (FIG. 4G, negative patterning) or has been removed by the developer (FIG. 4H, positive patterning).

The process just described produces a porous material consisting of silicalite nanocrystals, which are themselves porous, linked by an amorphous solid. The silicalite nanocrystals constitute the major component of the silicalite/binder porous material. It is expected that an overall porosity of at least about 50% and dielectric constants in the range of about 2.2 to about 2.6 may be achieved by this process.

As described in examples 1–5 below, the formation of photo-patternable low k materials has been demonstrated with compositions including silicalite and methacrylate-substituted POSS molecules. It is expected that directly patternable low k dielectric materials may also be formed using matrix materials other than porous silicon and/or using binder materials other than substituted POSS molecules.

Use of the disclosed photo-patternable low k materials as an insulating layer is readily integrated into standard processes for producing multilayer integrated circuit devices. For example, a dual damascene process for fabricating structures with copper interconnects is illustrated schematically in FIGS. 5A–5N. A first metal layer including copper conductor 20 is shown in FIG. 5A. A thin layer of silicon nitride or silicon oxynitride or silicon carbide 22 serves as an etch stop layer and barrier against diffusion of copper between metal levels. Insulating layer 24 is deposited over the silicon nitride layer 22. A negative patterning photo-patternable low k dielectric material disclosed above including, for example, silicalite and a methacrylate POSS binder is used as insulating layer 24.

FIG. 5B shows insulating layer 24 exposed to light rays masked by mask 26 to define a via. The exposed portions of insulating layer 24 cross-ink and become insoluble in the developer solvent. Insulating layer 24 is subsequently developed (FIG. 5C) to form the via. The edges of the via are rough due to the particles from which layer 24 is formed. Consequently, a liner 28 (FIG. 5D) of, for example, SiO₂ deposited by plasma enhanced chemical vapor deposition (PECVD) is deposited on the top surface of layer 24 and on the sides of the via to smooth these surfaces.

Another insulating layer 30 (FIG. 5E) formed from the photo-patternable low k dielectric material is deposited on liner 28. Layer 30 is exposed to light rays masked by mask 32 (FIG. 5F) to define a trench and subsequently developed (FIG. 5G) to form the trench. A liner 34 (FIG. 5H) is deposited on the top surface of layer 30 and the sides of the trench to smooth these surfaces also. Copper conductor 20 is exposed by an etch of liner 34 (FIG. 5I), a barrier layer of, for example, Ta, TaN, TiN, Ti(Si)N, or WN and a seed layer of copper (collectively 36) are deposited on liner 34 and the exposed surface of conductor 20 (FIG. 5J), and copper 38 is electrodeposited in the via and the trench (FIG. 5K). The copper is polished back to the surface of layer 30 (FIG. 5L), and another copper barrier layer 40 (FIG. 5M) is formed over the stack.

One of ordinary skill in the art will recognize that a dual damascene process incorporating a directly patternable low k material may vary from that just described by the addition or elimination of process steps. For example, in some implementations the low k dielectric layers may be exposed to an agent such as hexamethyldisilazane (HMDS) to make the layers more hydrophobic and to improve adhesion of the layers to the layers above them in the device. In addition, the resulting structure may incorporate more or fewer layers than shown in FIGS. 5A–5M. Such dual damascene processes incorporating directly patternable low k materials eliminate numerous process steps and associated capital cost compared to dual damascene methods using conventional low k insulating materials. The capital cost reduction is realized, for example, because the requirements of etching and ashing, which typically are carried out in two different tools, are eliminated. These benefits may be realized even if only a fraction of the total dielectric stack is patterned in the manner here described.

While the present invention is illustrated with particular embodiments, the invention is intended to include all variations and modifications falling within the scope of the appended claims. Although the illustrated embodiments are directly patternable low k materials, in other embodiments the binder may provide functions other than photo-patternability and the matrix material may be selected to optimize properties other than the dielectric constant. For example, other embodiments may utilize binder molecules that fluoresce to form a material that amplifies light. As another example, other embodiments may utilize binder molecules that rotate the polarization of light. Other embodiments may utilize matrix materials other than porous silicon and/or use binder materials other than substituted POSS molecules.

EXAMPLES

It is difficult to directly measure the percentage of silicalite solids in a silicalite colloidal suspension, hence such measurements are not routinely made. The inventors have established, however, that an approximately 5% (by weight) silicalite colloidal suspension will yield a film having a thickness of about 5000 Angstroms (Å) when spun onto a silicon substrate at about 800 revolutions per minute (rpm). The inventors believe that the relationship between film thickness and silicalite concentration varies approximately linearly near silicalite concentrations of about 5% by weight.

The following experiments were performed based on a working hypothesis that identical silicalite concentrations will yield identical film thicknesses, provided that the films are prepared in substantially the same manner. For example, two colloidal suspensions (of about the same size silicalite crystals) that yield about the same film thickness after spinning at 800 rpm are considered to have about the same silicalite concentration. Generally, the concentration of silicalite in a colloidal suspension is adjusted by dilution or by boiling until a target thickness (and thus, a target concentration) is reached after spinning at 800 rpm. Consequently, the silicalite concentrations used in the following experiments can be inferred from and are best characterized by the thicknesses of the resulting films.

Example 1

A colloidal suspension of silicalite crystals (having average diameters of about 300 Å to about 400 Å) in 1-propanol was prepared. The 8-fold substituted methacrylate-POSS discussed above was added to the colloidal suspension to a concentration of about 7.3 milligrams/milliliter (mg/ml). The mixture of silicalite and methacrylate-POSS was sonicated for about three hours (in a series of ½ hour periods to avoid generating too much heat during ultrasonication) and kept overnight to generate a smooth premix, and then filtered through a one micron filter.

A double coating (two 3 ml aliquots) of the filtered colloidal suspension was spin coated onto each of several silicon substrates at about 800 RPM using a conventional spin coating apparatus to form films having a thickness of about 1300 (Å). The resulting films were baked for about 1 minute at about 80° C. to about 110° C. to remove the solvent. The substrates were then placed in a pressure chamber, and a portion of the film on each substrate was exposed under about 600 torr of oxygen to ultraviolet radiation having a wavelength of about 248 nm. The ultraviolet light was generated by an Excimer laser operated with a repetition rate of about 74 Hz, a sweep rate of about 0.5 millimeters/second, and a pulse energy of about 100 millijoules (mJ) to about 280 mJ. The films were subsequently removed from the pressure chamber, spin washed with 1-propanol at about 800 RPM for at least about 50 seconds, and spun dry for at least about 70 seconds.

For films cured at pulse energies of about 277 mJ, about 220 mJ, and about 160 mJ, the portions exposed to ultraviolet light remained almost intact after washing and the unexposed portions washed away. The cured films were very hydrophobic. Cured films dipped into deionized water for greater than about 16 hours remained intact and hydrophobic. Cured films passed a tape test and thereby demonstrated good adhesion to their substrates.

Example 2

The silicalite/methacrylate-POSS mixture of Example 1 was spin coated onto a substrate as described in Example 1. The resulting film was baked for about 1 minute at about 60° C. (soft bake) to remove the solvent and then cured twice with 248 nm ultraviolet as described in Example 1, except that in this example the laser pulse energy was about 315 mJ. The ultraviolet cured film was spin washed with propanol, spun dry, and then thermally cured at about 400° C. for about 10 minutes to drive off remaining solvent. The spin washing removed 80–90% of the uncured film. The washed film was exposed to about 1 atmosphere of hexamethyldisilazane (HMDS) vapor at room temperature for about 10 minutes, and then baked at about 200° C. in ambient atmosphere for about 2 minutes to drive off excess HMDS. The resulting cured film had a thickness of about 1040 Angstroms and a dielectric constant of about 2.66.

Example 3

The silicalite/methacrylate-POSS of Example 1 was added to the silicalite colloidal suspension of Example 1 to a concentration of about 5.2 mg/ml to form a mixture otherwise similar to that of Example 1. This mixture was spin coated onto a substrate and processed as described in Example 2, except that it was cured with ultraviolet radiation only once and there was no soft bake step prior to ultraviolet curing. Spin washing removed 80–90% of the uncured film. The resulting cured film had a thickness of about 1490 Angstroms and a dielectric constant of about 2.5.

Example 4

The substituted methacrylate-POSS of Example 1 was added to the silicalite colloidal suspension of Example 1 to a concentration of about 9.7 mg/ml to form a mixture otherwise similar to that of Example 1. This mixture was spin coated onto a silicon substrate and processed as described in Example 3 with similar results. The resulting cured film had a thickness of about 1530 Angstroms and a dielectric constant of about 2.97.

Example 5

Another colloidal suspension of silicalite crystals (having average diameters of about 300 Å to about 400 Å) in 1-propanol was prepared. The substituted methacrylate-POSS of Example 1 was added to the silicalite colloidal suspension to a concentration of about 3.9 mg/ml to form a mixture otherwise similar to that of Example 1. This mixture was spin coated onto a silicon substrate and processed as described in Example 3, except that this example the laser pulse energy was about 300 mJ. The resulting cured film had a thickness of about 2900 Angstroms and a dielectric constant of about 2.06.

The variation of the dielectric constant of the resulting film with the concentration of the substituted methacrylate-POSS binder observed in the above examples is summarized in Table 1.

TABLE 1

| film thickness (Å) | binder concentration (mg/ml) | dielectric constant |
|---|---|---|
| ~2900 | 3.9 | 2.06 |
| ~1490 | 5.2 | 2.5 |
| ~1040 | 7.3 | 2.66 |
| ~1530 | 9.7 | 2.97 |

We claim:

1. A composition of comprising:
   a first component that exhibits a predetermined change in response to radiation; and
   a second component;
   wherein upon curing of said composition portions of said first component bind together portions of said second component to form an inhomogeneous material having physical properties substantially determined by said second component, wherein said second component comprises porous silica particles, and wherein said first component is a minority component of said inhomogeneous material.

2. A composition, comprising:
a first component that exhibits a predetermined change in response to radiation; and
a second component;
wherein upon curing of said composition portions of said first component bind together portions of said second component to form an inhomogeneous material having physical properties substantially determined by said second component, wherein said second component comprises porous silica particles, and wherein said second component is a majority component of said inhomogeneous material.

3. A composition comprising:
a first component that exhibits a predetermined change in response to radiation; and
a second component; wherein upon curing of said composition portions of said first component bind together portions of said second component to form an inhomogeneous material having physical properties substantially determined by said second component,
wherein a ratio of a size of one of said portions of said second component to a size of one of said portions of said first component is greater than about 5.

4. The composition of claim 3, wherein said ratio is greater than about 10.

5. The composition of claim 1, wherein said radiation includes ultraviolet light.

6. The composition of claim 1,
wherein said predetermined change in response to radiation includes dissociation.

7. The composition of claim 1, wherein said predetermined change in response to radiation includes polymerization.

8. A composition comprising:
a first component that provides a predetermined response to radiation; and
a second component;
wherein upon curing of said composition portions of said first component bind together portions of said second component to form an inhomogeneous material having physical properties substantially determined by said second component,
wherein said first component comprises a photosensitive derivative of a polyhedral oligomeric silsesquioxane.

9. A composition comprising:
a first component that provides a predetermined response to radiation; and
a second component;
wherein upon curing of said composition portions of said first component bind together portions of said second component to form an inhomogeneous material having physical properties substantially determined by said second component,
wherein said first component comprises a methacrylate substituted polyhedral oligomeric silsesquioxane.

10. The composition of claim 1, wherein said second component comprises silicalite particles.

11. The composition of claim 1, further comprising a material that responds to light to initiate a polymerization reaction.

12. The composition of claim 1, wherein said physical properties are macroscopic physical properties.

13. The composition of claim 1, wherein said macroscopic physical properties include a dielectric constant of said inhomogeneous material.

14. The composition of claim 1, wherein said inhomogeneous material has a dielectric constant less than about 2.6.

15. An integrated circuit comprising:
a metal layer; and
an insulating layer overlying said metal layer, said insulating layer comprising:
a first component that exhibits a predetermined change in response to radiation; and
a second component;
wherein upon curing of said composition portions of said first component bind together portions of said second component to form an inhomogeneous material having physical properties substantially determined by said second component, wherein said second component comprises porous silica particles, and wherein said predetermined change includes polymerization.

16. An integrated circuit comprising:
a metal layer; and
an insulating layer overlying said metal layer, said insulating layer comprising:
a first component that exhibits a predetermined change in response to radiation; and
a second component;
wherein upon curing of said composition portions of said first component bind together portions of said second component to form an inhomogeneous material having physical properties substantially determined by said second component,
wherein said second component comprises porous silica particles, and wherein said first component comprises a photosensitive derivative of a polyhedral oligomeric silsesquioxane.

17. An integrated circuit comprising:
a metal layer; and
an insulating layer overlying said metal layer, said insulating layer comprising:
a first component that exhibits a predetermined change in response to radiation; and
a second component;
wherein upon curing of said composition portions of said first component bind together portions of said second component to form an inhomogeneous material having physical properties substantially determined by said second component,
wherein said second component comprises porous silica particles, and wherein said first component comprises a methacrylate substituted polyhedral oligomeric silsesquioxane.

18. An integrated circuit comprising:
a metal layer; and
an insulating layer overlying said metal layer, said insulating layer comprising:
a first component that exhibits a predetermined change in response to radiation; and
a second component;
wherein upon curing of said composition portions of said first component bind together portions of said second component to form an inhomogeneous material having physical properties substantially determined by said second component, wherein said second component comprises porous silica particles, and wherein said second component comprises silicalite particles.

19. The integrated circuit of claim 18 wherein said metal layer and said insulating layer are part of a dual damascene structure.

20. The integrated circuit of claim 18 wherein said metal layer comprises copper.

21. The integrated circuit of claim 18 comprising a barrier layer between said metal layer and said insulating layer.

22. The integrated circuit of claim 21 wherein said barrier layer comprises a material selected from the group consisting or silicon nitride, silicon oxynitride and silicon carbide.

23. The integrated circuit of claim 18 wherein said insulating layer has a dielectric constant in range of about 2.2 to about 2.6.

* * * * *

UNITED STATES PATENT AND TRADEMARK OFFICE
CERTIFICATE OF CORRECTION

PATENT NO. : 6,873,026 B1
DATED : March 29, 2005
INVENTOR(S) : Brunemeier et al.

It is certified that error appears in the above-identified patent and that said Letters Patent is hereby corrected as shown below:

Column 8,
Line 7, delete "cross-ink" and replace with -- cross-link --.

Signed and Sealed this

Third Day of January, 2006

JON W. DUDAS
*Director of the United States Patent and Trademark Office*